US009357638B2

(12) United States Patent
Lee et al.

(10) Patent No.: US 9,357,638 B2
(45) Date of Patent: May 31, 2016

(54) FLEXIBLE DISPLAY DEVICE AND FABRICATION METHOD THEREOF

(71) Applicant: LG DISPLAY CO., LTD., Seoul (KR)

(72) Inventors: Jae-Young Lee, Seo-Gu (KR); Jung-Hwan Lee, Dalseo-Gu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/331,773

(22) Filed: Jul. 15, 2014

(65) Prior Publication Data
US 2014/0328033 A1 Nov. 6, 2014

Related U.S. Application Data

(62) Division of application No. 12/952,982, filed on Nov. 23, 2010, now Pat. No. 8,817,223.

(30) Foreign Application Priority Data

Nov. 23, 2009 (KR) .................. 10-2009-0113476

(51) Int. Cl.
*H05K 1/02* (2006.01)
*B32B 17/06* (2006.01)
(Continued)

(52) U.S. Cl.
CPC .............. *H05K 1/028* (2013.01); *B32B 17/061* (2013.01); *G02F 1/133305* (2013.01);
(Continued)

(58) Field of Classification Search
CPC ... H05K 1/028; H05K 1/0306; G02F 1/13452
USPC .................. 349/107; 361/679.01; 445/24
See application file for complete search history.

(56) References Cited

U.S. PATENT DOCUMENTS 7,345,729 B2 * 3/2008 Ohta et al. ..................... 349/141
7,382,432 B2 * 6/2008 Yanagawa ............. G02F 1/1333
349/153

(Continued)

FOREIGN PATENT DOCUMENTS

JP 2000-112399 4/2000
JP 2005-084228 * 3/2005 ............ G02F 1/1333
JP 2009-230072 10/2009

OTHER PUBLICATIONS

Office Action issued in corresponding Chinese Patent Application No. 201010621605.4, mailed Dec. 4, 2012.

(Continued)

*Primary Examiner* — Sang V Nguyen
(74) *Attorney, Agent, or Firm* — Brinks Gilson & Lione

(57) ABSTRACT

Disclosed is a flexible display device capable of forming a display device on a glass substrate and simultaneously ensuring flexibility, and a fabrication method thereof, the method including preparing a glass substrate having a display region and a non-display region defined on a front surface thereof, forming a display device on the display region defined on the front surface of the glass substrate, preparing a metal foil substrate, bonding the metal foil substrate to the glass substrate such that a front surface of the metal foil substrate faces the front surface of the glass substrate so as to seal the display device, attaching a first passivation film on a region of a rear surface of the glass substrate, the region corresponding to a part or all of the non-display region defined on the front surface of the glass substrate, and attaching a second passivation film on an entire rear surface of the metal foil substrate, performing a first etching with respect to the display region of the rear surface of the glass substrate by using the first passivation film as a mask, removing the first passivation film, and performing a second etching with respect to the display region and the non-display region of the rear surface of the glass substrate, removing the second passivation film, and mounting a display device driving unit on the non-display region defined on the front surface of the glass substrate.

5 Claims, 5 Drawing Sheets

(51) Int. Cl.
*G02F 1/1333* (2006.01)
*H01L 51/00* (2006.01)
*H05K 1/03* (2006.01)
*G02F 1/1345* (2006.01)

(52) U.S. Cl.
CPC ......... *H01L 51/0097* (2013.01); *H05K 1/0306* (2013.01); *G02F 1/13452* (2013.01); *G02F 2001/133368* (2013.01); *Y02E 10/549* (2013.01)

(56) References Cited

U.S. PATENT DOCUMENTS 7,894,008 B2 * 2/2011 You et al. ........................ 349/38

| | | |
|---|---|---|
| 2006/0027535 A1 | 2/2006 | Furuya |
| 2008/0110862 A1 | 5/2008 | Kim et al. |
| 2009/0015747 A1 * | 1/2009 | Nishizawa ........ G02F 1/133308 349/58 |
| 2009/0161048 A1 * | 6/2009 | Satake et al. .................. 349/110 |
| 2009/0323009 A1 | 12/2009 | Paek et al. |
| 2010/0208494 A1 * | 8/2010 | Kuo et al. ..................... 362/612 |
| 2011/0019129 A1 * | 1/2011 | Nishizawa et al. ............. 349/64 |
| 2012/0020056 A1 * | 1/2012 | Yamagata et al. ........... 362/97.1 |

OTHER PUBLICATIONS

Office Action issued in corresponding Korean Patent Application No. 10-2009-0113476, mailed Apr. 19, 2013.

* cited by examiner

FLEXIBLE DISPLAY DEVICE AND FABRICATION METHOD THEREOF

RELATED APPLICATIONS

The present patent document is a divisional of U.S. patent application Ser. No. 12/952,982, filed Nov. 23, 2010, which claims priority to Korean Patent Application No. 10-2009-0113476 filed in Korea on Nov. 23, 2009, which is hereby incorporated by reference.

BACKGROUND

1. Field of the Disclosure

The present disclosure relates to a flexible display device and a fabrication method thereof, and particularly, to a flexible display device capable of forming a display device on a glass substrate and simultaneously ensuring flexibility, and a fabrication method thereof.

2. Background of the Disclosure

Electronic display devices are is gradually playing a more significant role these days in today's information society, and various types of electronic display devices are widely used in industrial fields and in ordinary lives.

An electronic display device is usually used for a television, a computer monitor and the like. Among others, a cathode ray tube (CRT) display device, has the longest history and takes the top market share position but has many disadvantages, such as a heavy weight, a large size, a high power consumption and the like.

Consequently, recently, rapid improvement of semiconductor technologies has led to the development of new electronic display devices, namely, flat panel display devices, such as organic electroluminescent devices, liquid crystal display devices and the like. Such flat panel display devices can be designed to be light in weight and thin.

Recently, in addition to those attractive characteristics, such as light weight, thin thickness and the like, the flat panel display device is made flexible, which allows its transformation. Accordingly, researches on a flexible display device, which can be conveniently used at anytime in any place, are actively conducted.

A typical flexible display device according to the related art will be described with reference to the accompanying drawing.

FIG. 1 is a sectional view of the typical flexible display device according to the related art.

As shown in FIG. 1, the related art flexible display device includes a first substrate 1, and a second substrate 2 disposed to face the first substrate 1 so as to seal a display device 3 on the first substrate 1. The first substrate 1 is made of plastic or metal foil, and the second substrate 2 is made of an inorganic material or plastic. The display device 3 is a flat panel display device, such as an organic electroluminescent device or a liquid crystal display device.

With the configuration of the related art flexible display device, if the first substrate 1 is made of plastic, the substrate is good in a light weight and also the plastic is the most suitable material for a roll-to-roll fabrication method. However, the plastic substrate may be in danger of being deformed due to heat during fabrication process. On the other hand, if the second substrate 2 is made of a metal foil, it is appropriate for installing a high functional display device and driving integrated circuits, but the flatness of its surface is worse than plastic or glass and wrinkles are easily generated on the substrate even when being slightly curved or bent.

SUMMARY

A flexible display device includes a glass substrate having a display region and a non-display region defined on a front surface thereof, the display region being thinner than the non-display region, a display device formed on the display region defined on the front surface of the glass substrate, a display device driving unit mounted on the non-display region defined on the front surface of the glass substrate, and a metal foil substrate bonded to correspond to the display region defined on the front surface of the glass substrate to seal the display device.

In accordance with one embodiment, there is provided a method for fabricating a flexible display device including preparing a glass substrate having a display region and a non-display region defined on a front surface thereof, forming a display device on the display region defined on the front surface of the glass substrate, preparing a metal foil substrate, bonding the metal foil substrate to the glass substrate such that a front surface of the metal foil substrate faces the front surface of the glass substrate so as to seal the display device, attaching a first passivation film on a region of a rear surface of the glass substrate, the region corresponding to a part or all of the non-display region defined on the front surface of the glass substrate, and attaching a second passivation film on an entire rear surface of the metal foil substrate, performing a first etching with respect to the display region of the rear surface of the glass substrate by using the first passivation film as a mask, removing the first passivation film, and performing a second etching with respect to the display region and the non-display region of the rear surface of the glass substrate, removing the second passivation film, and mounting a display device driving unit on the non-display region defined on the front surface of the glass substrate.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EXEMPLARY EMBODIMENTS

Description will now be given in detail of a flexible display device and a fabrication method thereof in accordance with an exemplary embodiment, with reference to the accompanying drawings.

Hereinafter, a flexible display device according to an exemplary embodiment will be described with reference to FIGS. 2 to 6.

Figure 1:
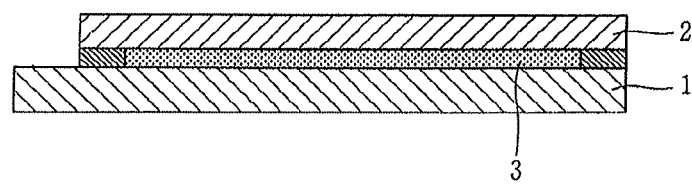
FIG. 1 is a sectional view showing a typical flexible display device according to the related art.
Figure 2:
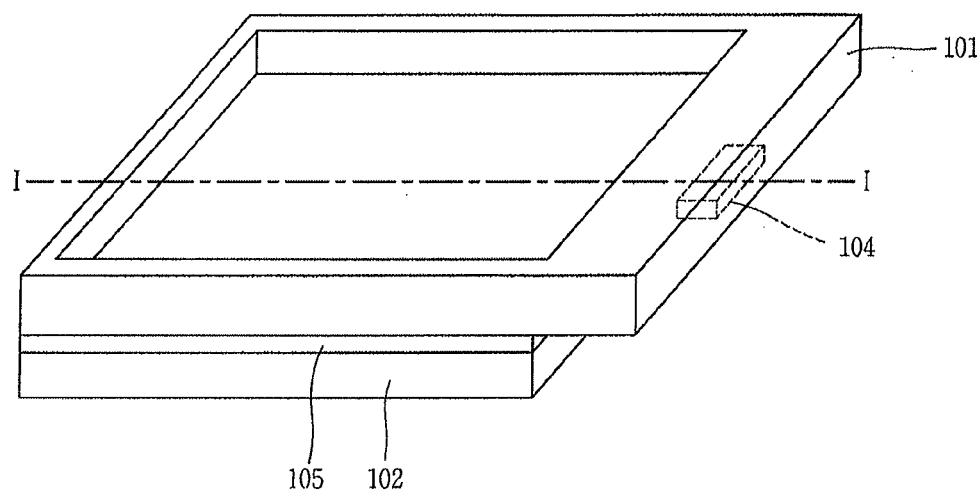
FIG. 2 is a perspective view showing a flexible display device in accordance with an exemplary embodiment.
Figure 3:
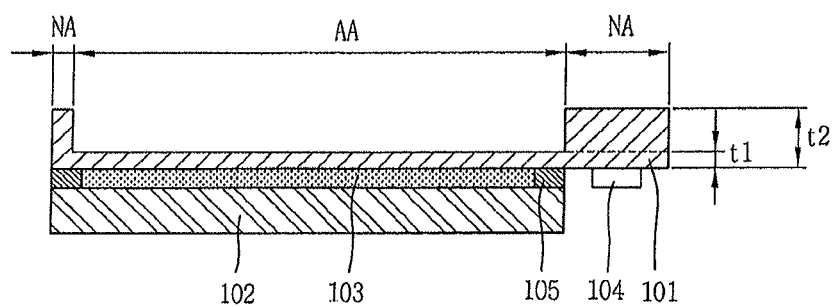
FIG. 3 is a sectional view taken along the line I-I' of FIG. 2.
Figure 4:
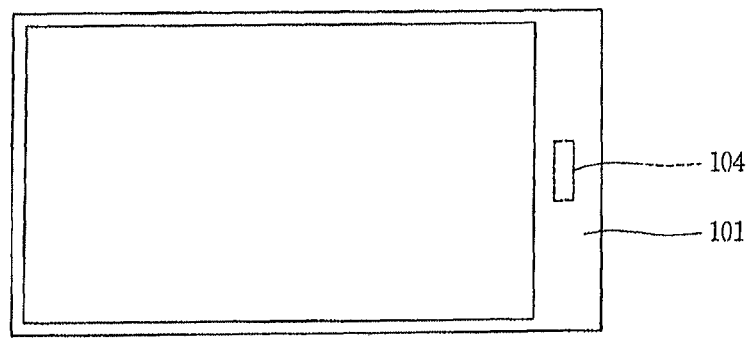
FIG. 4 is a top planar view of the flexible display device of FIG. 2.
Figure 5:
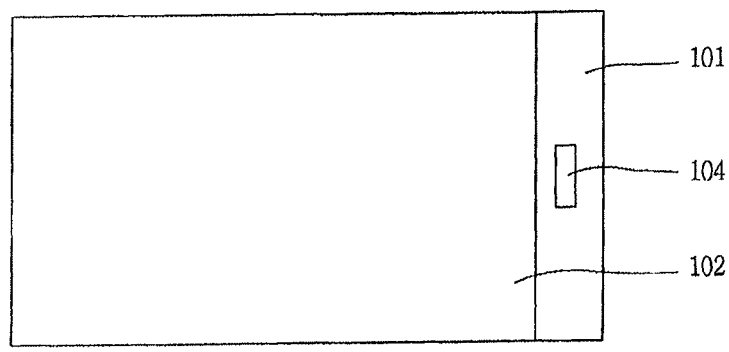
FIG. 5 is a bottom planar view of the flexible display device of FIG. 2.
Figure 6:
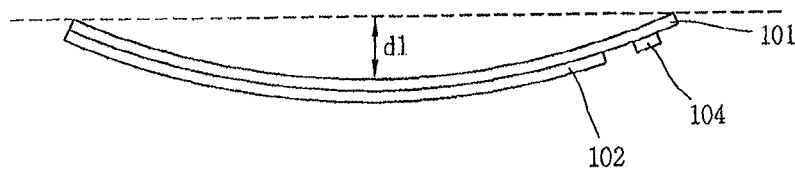
FIG. 6 is a side view showing a curved state of the flexible display device of FIG. 2.

FIG. 2 is a perspective view showing a flexible display device in accordance with an exemplary embodiment, FIG. 3 is a sectional view taken along the line I-I' of FIG. 2, FIG. 4 is a top planar view of the flexible display device of FIG. 2, FIG. 5 is a bottom planar view of the flexible display device of FIG. 2, and FIG. 6 is a side view showing a curved state of the flexible display device of FIG. 2.

Referring to FIGS. 2 to 5, a flexible display device according to an exemplary embodiment may include a glass substrate 101 having a display region AA and a non-display region NA defined on a front surface thereof, the display region AA being thinner than the non-display region NA, a display device 103 formed on the display region AA defined on the front surface of the glass substrate 101, a display device driving unit 104 formed on the non-display region NA defined on the front surface of the glass substrate 101, and a metal foil substrate 102 bonded to face the display region AA defined on the front surface of the glass substrate 101 so as to seal the display device 103.

Hereinafter, description will be given of each component of the flexible display device according to the exemplary embodiment with the configuration.

Referring to FIGS. 3 to 5, the flexible display device according to the exemplary embodiment may include the glass substrate 101 having the display device 103, and a metal foil substrate 102 facing the glass substrate 101.

The display region AA and the non-display region NA may be defined on the front surface of the glass substrate 101, and the display device 103 may be formed on the display region AA.

The glass substrate 101 may be configured such that the display region AA is thinner than the non-display region NA. In order to urge a panel curved, the display region AA of the glass substrate 101 may have a thickness in the range of about 0.03 mm to about 0.05 mm. Also, in order to avoid a damage on the glass substrate 101 upon mounting the display device driving unit 104 on the non-display region NA of the glass substrate 101, the non-display region NA may be more than about 0.2 mm in thickness. Here, the very thin thickness of the display region AA of the glass substrate 101 in the range of about 0.03 mm to about 0.05 mm and also the difference in thickness between the display region AA and the non-display region NA may result from an etching operation, which is performed two times onto the rear surface of the glass substrate 101 during the fabrication process. Such structure will be understood hereinafter by the description of a method for fabricating the flexible display device in accordance with an exemplary embodiment.

The display device 103 formed on the glass substrate 101 may be implemented in different variations without departing from the spirit or scope of the present disclosure. A representative example of the display device 103 may be an organic electroluminescent device.

The display device driving unit 104 for driving the display device 103 may be mounted on the non-display region NA of the glass substrate 101. The display device driving unit 104 may be fabricated in the form of an integrated circuit (IC).

The metal foil substrate 102 facing the glass substrate 101 may be bonded to the glass substrate 101 by use of an adhesive 105 or the like with facing the display region AA defined on the front surface of the glass substrate 101, so as to seal the display device 103, thereby protecting the display device 103 from humidity or the like.

Referring to FIG. 6, the panel formed by bonding the glass substrate 101 and the metal foil substrate 102 to each other may be allowed to be curved in a form that the glass substrate 101 is positioned inside and the metal foil substrate positioned outside when a force is applied to a central area of the rear surface of the glass substrate 101. In this case, a difference d1 in height between an end region and a central region of the metal foil substrate 102 may be in the range between 15 mm and 20 mm.

Hereinafter, description will be made of a method for fabricating the flexible display device in accordance with an exemplary embodiment with reference to FIGS. 7A to 7G and FIG. 3.

Figure 7A:
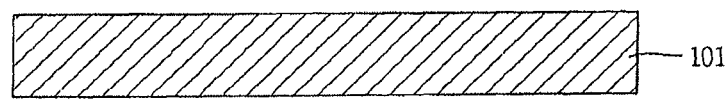
FIGS. 7A to 7G are sectional views sequentially showing a method for fabricating the flexible display device of FIG. 2.

First, referring to FIG. 7A, the glass substrate 101 having the display region AA and the non-display region NA on its surface is prepared.

Figure 7B:
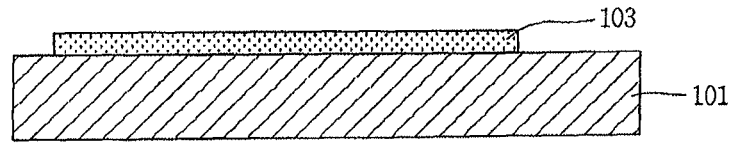

Referring to FIG. 7B, the display device 103 is formed on the display region AA defined on the front surface of the glass substrate 101.

Here, the display device 103 formed on the display region AA defined on the front surface of the glass substrate 101 may be implemented in different variations without departing from the spirit or scope of the present disclosure. A representative example of the display device 103 may be an organic electroluminescent device.

Figure 7C:
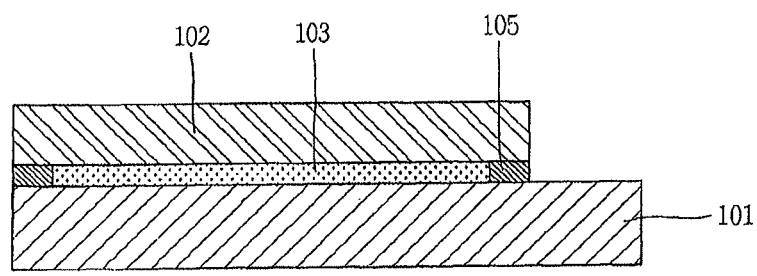

After preparing the metal foil substrate 102, referring to FIG. 7C, the metal foil substrate 102 is bonded to the glass substrate 101 such that the front surface of the metal foil substrate 102 faces the front surface of the glass substrate 101, thereby sealing the display device 103.

Here, a method for bonding the metal foil substrate 102 and the glass substrate 101 to each other may include bonding the two substrates by adding an adhesive 105 onto an edge of the display region AA of the glass substrate 101 on the region between the front surface of the metal foil substrate 102 and the front surface of the glass substrate 101.

Figure 7D:
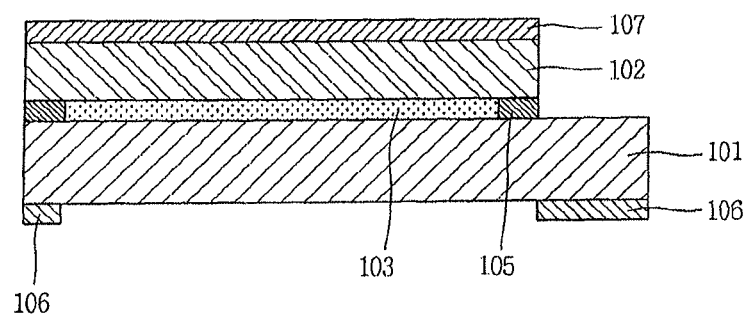
Figure 7E:
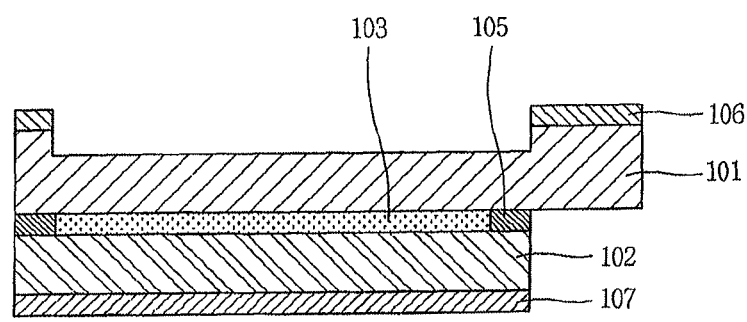

Referring to FIG. 7D, a first passivation film 106 is attached onto a region of the rear surface of the glass substrate 101, which corresponds to a part or all of the non-display region NA of the front surface of the glass substrate 101, and a second passivation film 107 is attached all over the rear surface of the metal foil substrate 102. Next, a first etching operation is performed with respect to the rear surface of the glass substrate 101 by using the first passivation film 106 as a mask, thereby removing the display region AA of the rear surface of the glass substrate 101 by a preset thickness, as shown in FIG. 7E. Here, a wet etching may be employed as an etching method. Among several types of wet etching methods, it may be appropriate to employ a wet etching method, in which a spray nozzle of an etching device is placed above the glass substrate 101 to spray an etching solution onto the rear surface of the glass substrate 101.

During the first etching operation, the metal foil substrate 102 is protected by the second passivation film 107.

Figure 7F:
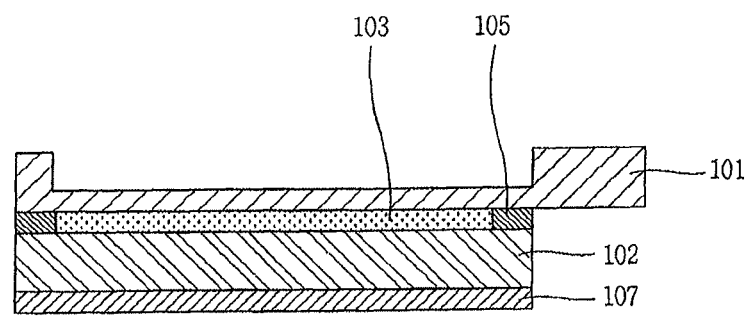

Afterwards, the first passivation film 106 attached onto the rear surface of the glass substrate 101 is removed and then a second etching is executed with respect to the rear surface of the glass substrate 101, thereby removing the display region AA and the non-display region NA of the rear surface of the glass substrate 101 by a preset thickness, as shown in FIG. 7F.

Consequently, in order to urge the glass substrate 101 curved after being bonded to the metal foil substrate 102, the display region AA of the glass substrate may have a thickness in the range of about 0.03 mm to about 0.05 mm. Also, in order to avoid a damage on the glass substrate 101 upon mounting the display device driving unit 104 on the non-display region NA of the glass substrate 101, the non-display region NA of the glass substrate 101 may be more than about 0.2 mm in thickness.

That is, the second etching operation may be performed such that the display region AA of the glass substrate 101 has a thickness in the range of about 0.03 mm to about 0.05 mm and simultaneously the non-display region NA of the glass substrate 101 has a thickness more than about 0.2 mm.

During the second etching, the metal foil substrate 102 is protected by the second passivation film 107.

Figure 7G:
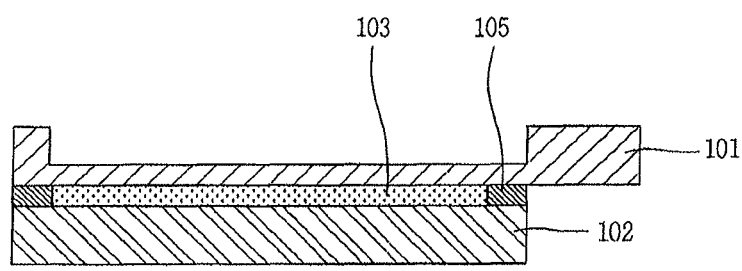

Referring to FIG. 7G, the second passivation film 107 attached onto the metal foil substrate 102 is removed, thereby mounting the display device driving unit 104 on the non-display region NA defined on the front surface of the glass substrate 101. Here, the display device driving unit 104 mounted on the non-display region NA of the glass substrate 101 may be fabricated in the form of an integrated circuit (IC).

In the description of the method for fabricating the flexible display device according to the exemplary embodiment, the glass substrate 101 and the metal foil substrate 102 are exemplarily described as a single substrate during the entire fabrication process, however, it is merely illustrative for the sake of explanation but not limited to this. Alternatively, the glass substrate 101 and the metal foil substrate 102 may be a mother substrate having a plurality of panel region defined thereon, and in this case, a process of cutting the glass substrate 101 into a panel region units prior to mounting the display device driving unit 104 on the non-display region NA of the glass substrate 101 may further be needed to be performed.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A flexible display device comprising:
   a glass substrate having a display region and a non-display region defined on a front surface thereof, the display region being surrounded with the non-display region and the display region being thinner than the non-display region;
   a display device formed on the display region defined on the front surface of the glass substrate;
   a display device driving unit mounted on the non-display region defined on the front surface of the glass substrate, the display device driving unit is in the form of an integrated circuit and is spaced apart from the display region; and
   a metal foil substrate bonded to the glass substrate to correspond to the display region defined on the front surface of the glass substrate to seal the display device,
   wherein the metal foil substrate does not overlap a portion of the non-display region on which the display device driving unit is disposed.

2. The device of claim 1, wherein the display region of the glass substrate has a thickness in the range of about 0.03 mm to about 0.05 mm.

3. The device of claim 1, wherein the non-display region of the glass substrate is more than about 0.2 mm in thickness.

4. The device of claim 1, wherein the bonded glass substrate and metal foil substrate is curved by a force applied to a central region of a rear surface of the glass substrate into the form that the glass substrate is positioned inside and the metal foil substrate is positioned outside, and in the curved state, a difference in height between an end region and a central region of the metal foil substrate is in the range of about 15 mm and about 20 mm.

5. The device of claim 1, wherein the display device driving unit is fabricated in the form of an integrated circuit.

* * * * *